United States Patent
Gopal et al.

(10) Patent No.: US 7,886,214 B2
(45) Date of Patent: Feb. 8, 2011

(54) DETERMINING A MESSAGE RESIDUE

(75) Inventors: Vinodh Gopal, Westborough, MA (US); Michael Kounavis, Hillsboro, OR (US); Gilbert Wolrich, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 515 days.

(21) Appl. No.: 11/959,142

(22) Filed: Dec. 18, 2007

(65) Prior Publication Data

US 2009/0157784 A1    Jun. 18, 2009

(51) Int. Cl.
*H03M 13/00* (2006.01)
(52) U.S. Cl. .................. 714/781; 714/751
(58) Field of Classification Search ............. 714/781, 714/758
See application file for complete search history.

(56) References Cited

U.S. PATENT DOCUMENTS

| | | | |
|---|---|---|---|
| 3,980,874 A | 9/1976 | Vora | |
| 4,945,537 A * | 7/1990 | Harada | 714/781 |
| 4,949,294 A | 8/1990 | Wambergue | |
| 5,166,978 A | 11/1992 | Quisquater | |
| 5,274,707 A | 12/1993 | Schlafly | |
| 5,384,786 A * | 1/1995 | Dudley et al. | 714/784 |
| 5,642,367 A * | 6/1997 | Kao | 714/784 |
| 5,920,702 A * | 7/1999 | Bleidt et al. | 709/231 |
| 5,942,005 A * | 8/1999 | Hassner et al. | 714/784 |
| 6,128,766 A * | 10/2000 | Fahmi et al. | 714/807 |
| 6,223,320 B1 | 4/2001 | Dubey et al. | |
| 6,396,926 B1 | 5/2002 | Takagi et al. | |
| 6,484,192 B1 * | 11/2002 | Matsuo | 708/492 |
| 6,530,057 B1 * | 3/2003 | Kimmitt | 714/758 |
| 6,609,410 B2 | 8/2003 | Axe et al. | |
| 6,721,771 B1 | 4/2004 | Chang | |
| 6,732,317 B1 | 5/2004 | Lo | |
| 6,795,946 B1 | 9/2004 | Drummond-Murray et al. | |
| 6,904,558 B2 | 6/2005 | Cavanna et al. | |
| 7,027,597 B1 | 4/2006 | Stojancic et al. | |
| 7,027,598 B1 | 4/2006 | Stojancic et al. | |
| 7,058,787 B2 | 6/2006 | Brognara et al. | |
| 7,171,604 B2 * | 1/2007 | Sydir et al. | 714/758 |
| 7,187,770 B1 | 3/2007 | Maddury et al. | |

(Continued)

FOREIGN PATENT DOCUMENTS

WO    2008/002828 A2    1/2008

(Continued)

OTHER PUBLICATIONS

International Search Report and Written Opinion received for PCT Patent Application No. PCT/US2008/068801, mailed on Dec. 31, 2008, 10 pages.

(Continued)

*Primary Examiner*—M. Mujtaba K Chaudry

(57) ABSTRACT

A description of techniques of determining a modular remainder with respect to a polynomial of a message comprised of a series of segments. An implementation can include repeatedly accessing a strict subset of the segments and transforming the strict subset of segments to into a smaller set of segments that are equivalent to the strict subset of the segments with respect to the modular remainder. The implementation can also include determining the modular remainder based on a set of segments output by the repeatedly accessing and transforming and storing the determined modular remainder.

17 Claims, 3 Drawing Sheets

U.S. PATENT DOCUMENTS

| | | | |
|---|---|---|---|
| 7,190,681 B1* | 3/2007 | Wu | 370/316 |
| 7,243,289 B1 | 7/2007 | Madhusudhana et al. | |
| 7,343,541 B2* | 3/2008 | Oren | 714/758 |
| 7,428,693 B2 | 9/2008 | Obuchi et al. | |
| 7,458,006 B2 | 11/2008 | Cavanna et al. | |
| 7,461,115 B2 | 12/2008 | Eberle et al. | |
| 7,543,214 B2 | 6/2009 | Ricci | |
| 2002/0053232 A1 | 5/2002 | Axe et al. | |
| 2002/0144208 A1 | 10/2002 | Gallezot et al. | |
| 2003/0167440 A1* | 9/2003 | Cavanna et al. | 714/781 |
| 2003/0202657 A1 | 10/2003 | She | |
| 2003/0212729 A1 | 11/2003 | Eberle et al. | |
| 2004/0083251 A1 | 4/2004 | Geiringer et al. | |
| 2005/0044134 A1 | 2/2005 | Krueger et al. | |
| 2005/0138368 A1 | 6/2005 | Sydir et al. | |
| 2005/0149725 A1 | 7/2005 | Sydir et al. | |
| 2005/0149744 A1 | 7/2005 | Sydir et al. | |
| 2005/0149812 A1 | 7/2005 | Hall et al. | |
| 2005/0154960 A1* | 7/2005 | Sydir et al. | 714/758 |
| 2006/0059219 A1 | 3/2006 | Koshy et al. | |
| 2006/0282743 A1 | 12/2006 | Kounavis | |
| 2006/0282744 A1 | 12/2006 | Kounavis | |
| 2007/0083585 A1 | 4/2007 | St Denis et al. | |
| 2007/0150795 A1 | 6/2007 | King et al. | |
| 2007/0157030 A1 | 7/2007 | Feghali et al. | |
| 2007/0297601 A1 | 12/2007 | Hasenplaugh et al. | |
| 2008/0092020 A1 | 4/2008 | Hasenplaugh et al. | |
| 2008/0144811 A1 | 6/2008 | Gopal et al. | |
| 2009/0019342 A1 | 1/2009 | Gueron et al. | |
| 2009/0157784 A1 | 6/2009 | Gopal et al. | |
| 2009/0158132 A1 | 6/2009 | Gopal et al. | |
| 2009/0164546 A1 | 6/2009 | Gopal et al. | |
| 2009/0168999 A1 | 7/2009 | Boswell et al. | |

FOREIGN PATENT DOCUMENTS

| | | |
|---|---|---|
| WO | 2008/002828 A3 | 2/2008 |
| WO | 2009/012050 A2 | 1/2009 |
| WO | 2009/012050 A3 | 3/2009 |
| WO | 2009/062598 A1 | 7/2009 |
| WO | 2009/085489 A2 | 7/2009 |
| WO | 2009/085489 A3 | 8/2009 |

OTHER PUBLICATIONS

International Preliminary Report on Patentability received for PCT Patent Application No. PCT/US2008/068801, mailed on Jan. 28, 2010, 6 pages.

International Preliminary Report on Patentability received for PCT Patent Application No. PCT/US2007/071829, mailed on Jan. 15, 2009, 7 Pages.

International Search Report & Written Opinion received for PCT Patent Application No. PCT/US2007/071829, mailed on Dec. 12, 2007, 10 Pages.

Bosselaers et al., "Comparsion of three modular reduction function", Comparative Description and Evaluation, Katholieke Universiteit Leuven, Department of Electrical Engineering-ESAT Kardinaal Mercierlaan, Oct. 25, 1993, pp. 1-12.

Chin-Bou et al., "Design and Implementation of Long-Digit Karatsuba's Multiplication Alogorithm Using Tensor Product Formulation", Workshop on Compiler Techniques for High Performance Computing, 2003, pp. 1-8.

Montgomery, "Five, Six, and Seven-Term Karatsuba-Like Formulae", IEEE Transactions on Computers, vol. 54, No. 3, Mar. 2005, 8 pages.

Sedlak, "The RSA Cryptography Processor", Lecture Notes In Computer Science, Proceedings of the 6th annual international conference on Theory and application of cryptographic techniques, Springer-Verlag Berlin, Heidelberg, pp. 95-105.

Montgomery, "Modular Multiplication Without Trial Division", Mathematics of 'Computation, vol. 44, No. 170, Apr. 1985, pp. 519-521.

Barrett, "Implementing the Rivest Shamir and Adleman Public Key Encryption Algorithm on a Standard Digital Signal Processor", Proceedings on Advances in cryptology-CRYPTO '86,Copyright (c) 1998, Springer-Verlag, Berlin 1987, pp. 311-323.

Fischer et al., "Duality Between Multiplicatio and Modular Reduction", Infineon Technologies AG, Secure Mobile Solutions, Munich, Germany; Intel Corporation, Systems Technology Laboratory, Hillsboro, OR; pp. 1-13.

Weimerskirch et al., "Generalizations of the Karatsuba Algorithm for Polynomial Multiplication"; communication Security Group, Department of Electrical Engineering & Information Sciences, Bochum, Germany, Mar. 2002; pp. 1-23.

Koc et al., "Analyzing and Comparing Montgomery Multiplication Algorithms", IEEE Micro, vol. 16, No. 3, 26-33, Jun. 1996; pp. 1-18.

Office Action Received for Chinese Patent Application No. 200610172839.9, mailed on Jan. 8, 2010, 3 Pages of Chinese Office Action and 5 Pages of English Translation.

Office Action Received for Chinese Patent Application No. 200610172839.9, mailed on Feb. 6, 2009, 3 Pages of Chinese Office Action and 5 Pages of English Translation.

Office Action Received for Chinese Patent Application No. 200610172839.9, mailed on Jul. 30, 2010, 5 Pages of English Translation.

Office Action Received for Chinese Patent Application No. 200610172839.9, mailed on Sep. 18, 2009, 4 Pages of Chinese Office Action and 5 Pages of English Translation.

Dhem, "Design of an Efficient Public-Key Cryptographic Library for RISC-Based Smart Cards" Faculte Des Sciences appliquees Laboratoire de Microelectronique, Louvain-la-Neuve, Belgium, May 1998, 198 pages.

"Number Theory and Public Key Cryptography", Introduction to Number Theory, pp. 1-14.

Phatak at al., "Fast Modular Reduction for Large Wordlengths via One Linear and One Cyclic Convolution", Proceedings of the 17th IEEE Symposium on Computer Arithmetic, 2005, pp. 179-186.

Sedlak, "The RSA Cryptography Processor", Lecture Notes In Computer Science, Proceedings of the 6th annual international conference on Theory and application of cryptographic techniques, 1987, Springer-Verlag Berlin, Heidelberg, pp. 95-105.

Tenca et al., "A Scalable Architecture for Montgomery Multiplication", Proceedings of the First International Workshop on Cryptographic Hardware and Embedded Systems, Lecture Notes in Computer Science,. No. 1717, Springer-Verlag London, UK, 1999, pp. 94-108.

Ramabadran et al., "A Tutorial on CRC Computations", Micro, IEEE, IEEE Computer Society, Aug. 1988, pp. 62-75.

Lin et al., "High-Speed CRC Design for 10 Gbps applications", ISCAS 2006, IEEE, pp. 3177-3180.

Williams, "A Painless Guide to CRC Error Detection Algorithms", Version 3; Aug. 19, 2003, Copyright 1993; 37 pages.

Sprachmann, "Automatic Generation of Parallel Circuits", IEEE Design and Test of Computers May-Jun. 2001; pp. 108-114.

Koopman et al., "Cyclic Redundancy Code (CRC) Polynomial Selection for Embedded Networks", The International Conference on Dependable Systems and Networks, DSN- 2004, pp. 1-10.

Campobello et al., "Parallel CRC Realization", IEEE Transactions on Computers, vol. 52, No. 10, Oct. 2003, Published by the IEEE Computer Society; pp. 1312-1319.

Kounavis et al., "A Systematic Approach to Building High Performance Software- based CRC Generators", Proceedings of the 10th IEEE Symposium on Computers and Communications, ISCC 2005; pp. 855-862.

Nedjah et al., "A Review of Modular Multiplication Methods and Respective Hardware Implementation", Informatica, vol. 30, No. 1, 2006, pp. 111-129.

Nedjah et al., "A reconfigurable recursive and efficient hardware for Karatsuba-Ofman's multiplication algorithm", Proceedings of 2003 IEEE Conference on Control Applications, vol. 2, Jun. 23-25, 2003, pp. 1076-1081.

International Search Report and Written Opinion received for PCT Patent Application No. PCT/US2008/084571, mailed Jun. 18, 2009, 11 pages.

International Preliminary Report on Patentability received for PCT Application No. PCT/US2008/084571 mailed on Jul. 1, 2010, 6 pages.

"Federal Information Processing Standards Publication 197", Announcing the Advanced Encryption Standard (AES), Nov. 26, 2001, pp. 1-51.

International Search Report and Written Opinion for PCT Patent Application No. PCT/US2008/085284, mailed on May 18, 2009, 11 pages.

International Preliminary Report on Patentability for PCT Patent Application No. PCT/US2008/085284, mailed on Jul. 1, 2010, 6 pages.

Office Action Received for Chinese Patent Application No. 200610172839.9, mailed on Apr. 15, 2010, 4 Pages of Chinese Office Action and 5 Pages of English Translation.

Office Action received for U.S. Appl. No. 11/777,538, mailed on Jul. 9, 2010, 6 pages.

Office Action Received for U.S. Appl. No. 11/476,432, mailed on Oct. 28, 2009, 24 Pages.

Office Action Received for U.S. Appl. No. 11/476,432, mailed on May 26, 2010, 13 Pages.

Office Action received for U.S. Appl. No. 11/610,919, mailed on Jul. 8, 2010, 7 pages.

Williams, "A Painless Guide to CRC Error Detection Algorithms", Version 3, Aug. 19, 1993, pp. 1-30.

Office Action received for U.S. Appl. No. 11/777,538, mailed on Jan. 8, 2010, 9 pages.

* cited by examiner

DETERMINING A MESSAGE RESIDUE

BACKGROUND

A variety of computer applications operate on messages to create a message residue. The residue can represent message contents much more compactly. Among other uses, message residues are frequently used to determine whether data transmitted over network connections or retrieved from a storage device may have been corrupted. For instance, a noisy transmission line may change a "1" signal to a "0", or vice versa. To detect corruption, a message is often accompanied by its message residue. A receiver of the data can then independently determine a residue for the message and compare the determined residue with the received residue.

A common message residue is known as a Cyclic Redundancy Check (CRC). A CRC computation is based on interpreting a stream of message bits as coefficients of a polynomial. For example, a message of "1010" corresponds to a polynomial of $(1\ x^3)+(0\ x^2)+(1\ x^1)+(0\ x^0)$ or, more simply, $x^3+x^1$. The message polynomial is divided by another polynomial known as the modulus. For example, the other polynomial may be "11" or x+1. A CRC is the remainder of a division of the message by the polynomial. CRC polynomial division, however, is somewhat different than ordinary division in that it is computed over the finite field GF(2) (i.e., the set of integers modulo 2). More simply put: even number coefficients become zeroes and odd number coefficients become ones.

DETAILED DESCRIPTION

Message residues are commonly used in many different protocols to protect data integrity. Computing these residues, however, imposes significant computational overhead. The following describes techniques that repeatedly whittle a message into a smaller set of equivalent data using fast, inexpensive operations. The resulting, smaller, set of data can then be processed, for example, in a conventional manner to arrive at a final message residue value. In other words, the more burdensome task of determining an exact value of a message residue is postponed until a message is reduced to a smaller size that retains the mathematical characteristics of the original message with respect to the residue.

Figure 1:
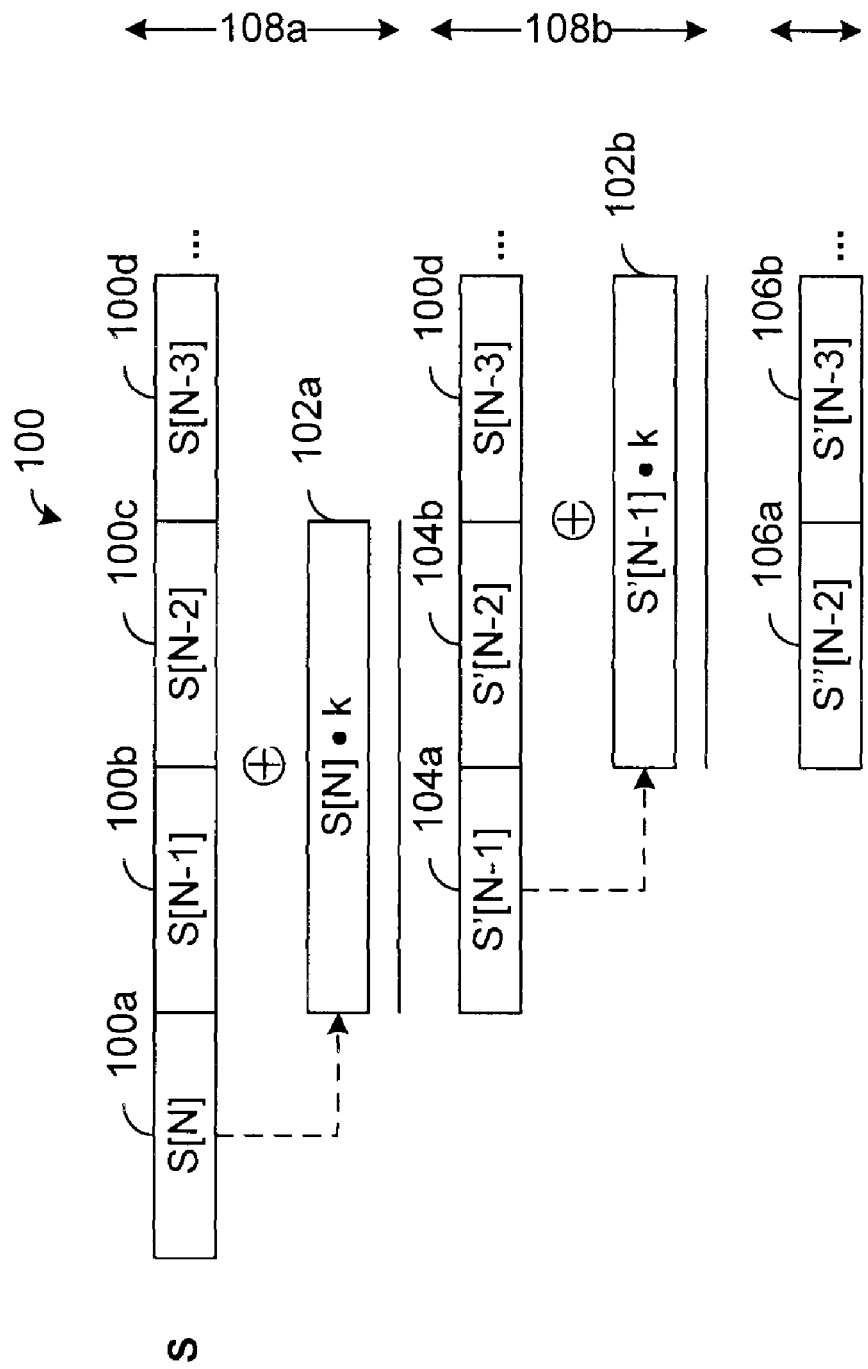
FIG. 1 is a diagram illustrating repeated reduction of data segments used to represent a message.

In greater detail, FIG. 1 depicts a message S 100. To determine a message residue, the bits of the message S can be handled as the coefficients of a polynomial S(x). For example, a 32-bit CRC of S can be defined as:

$$CRC = S \cdot 2^{32} \bmod g \qquad [1]$$

where g is a 33-bit polynomial. Different values of g have been defined for a variety of applications. For example, iSCSI (Internet Small Computer System Interface) defines a value of $11EDC6F41_{16}$ for g. Other applications have selected different polynomial sizes and values. Typically, the resulting CRC value is stored with the message, S, in the empty 32-least significant bits created by the $2^{32}$ shift. Alternately, the value may be stored in a packet field or other location. Recomputing the CRC value and comparing with the stored value can indicate whether data was corrupted.

As shown, S can be represented as a series of n-bit segments 100a, 100b, 100c, 100d. The following describes techniques that successively "fold" the most significant segment into remaining segments, repeatedly reducing the amount of data used to represent S by one segment. As described below, implementations of the folding operation are comparatively inexpensive in terms of computation and die impact.

FIG. 1 depicts the first two 108a, 108b of a series of repeated folding operations that operate on a subset of segments. In the example shown, each subset features the three most significant remaining segments representing S. For example, the initial folding operation 108a operates on segments 100a, 100b, 100c. As shown, the operation 108a includes a polynomial multiplication 102a of the most significant segment 100a by a pre-computed constant k. The result of this multiplication 102a is XOR-ed with the values of the least significant segments of the subset to yield segments 104a, 104b. The values of these segments 104a, 104b preserve the contribution of the most significant segment 100a to the final determination of the residue for S. Thus, segment 100a can be discarded or ignored for residue purposes.

As shown, the segments 104a, 104b output from the first folding operation 108a can be combined with the next segment of S 100d to form a new subset of segments. Again, the same folding operation 108b proceeds, folding the most significant segment 104a into segments 104b, 100d by a multiplication 102b of segment 104a by constant k and an XOR-ing of the result 102b with segments 104b, 100d to yield segments 106a, 106b.

This process of folding can repeat as desired to linearly reduce the data representing S by one segment for each folding operation. The reduction may be repeated any number of times. For example, in the sample implementation shown, folding may continue until only two segments remain. The residue of the final two segments (e.g., remaining-segments mod g) can be determined in a variety of ways such as described below in conjunction with FIG. 3.

Figure 2:
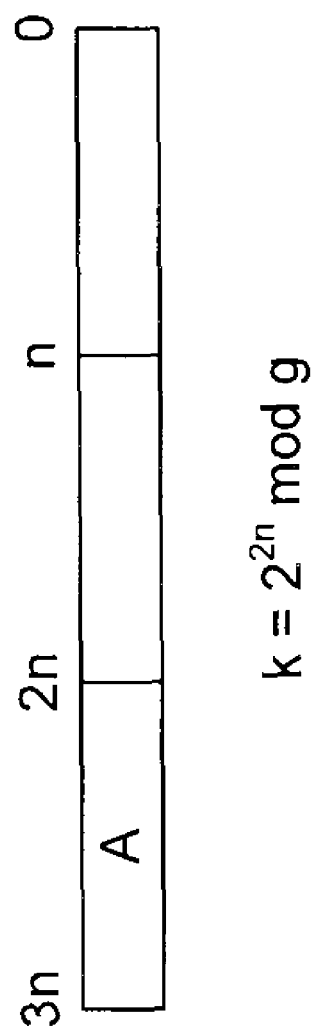
FIG. 2 is a diagram illustrating a reduction constant.

The folding operation shown in FIG. 1 uses a pre-computed constant k to speed computations. As shown in FIG. 2, the constant k may be determined as:

$$k = 2^{2n} \bmod g \qquad [2]$$

where n is the number of bits in a segment. The contribution of A (e.g., $A \cdot x^{2n}$) to the message residue can, thus, be expressed as $A \cdot k$ (e.g., 102a, 102b in FIG. 1). The technique is well suited to execution on processors that have a Galois-field (carry-less) multiplier, though such hardware is not an implementation requirement.

Since the polynomial g and n, the number of bits in each segment, are constants, k can be pre-computed and stored prior to processing of the data values of S. Potentially, different values of k can be pre-computed and stored for different values of n and g. Such an implementation can quickly switch between polynomials by a lookup of k based on g and/or n.

The specific examples described above illustrated determination of a 32-bit CRC polynomial. However, the techniques describe above work for arbitrary segment sizes. For example, n can be set as a number of bits equal to the (width of g) −1. Additionally, while the above described folding operations 108a, 108b that operate on 3-segments subsets, other implementations may operate on a different number of segments. For example, instead of 3:2 segment reduction another implementation may feature a 4:3 segment reduction and so forth. Additionally, while the above describes a CRC message residue, the techniques described above can be used in other operations that determine a message residue.

Figure 3:
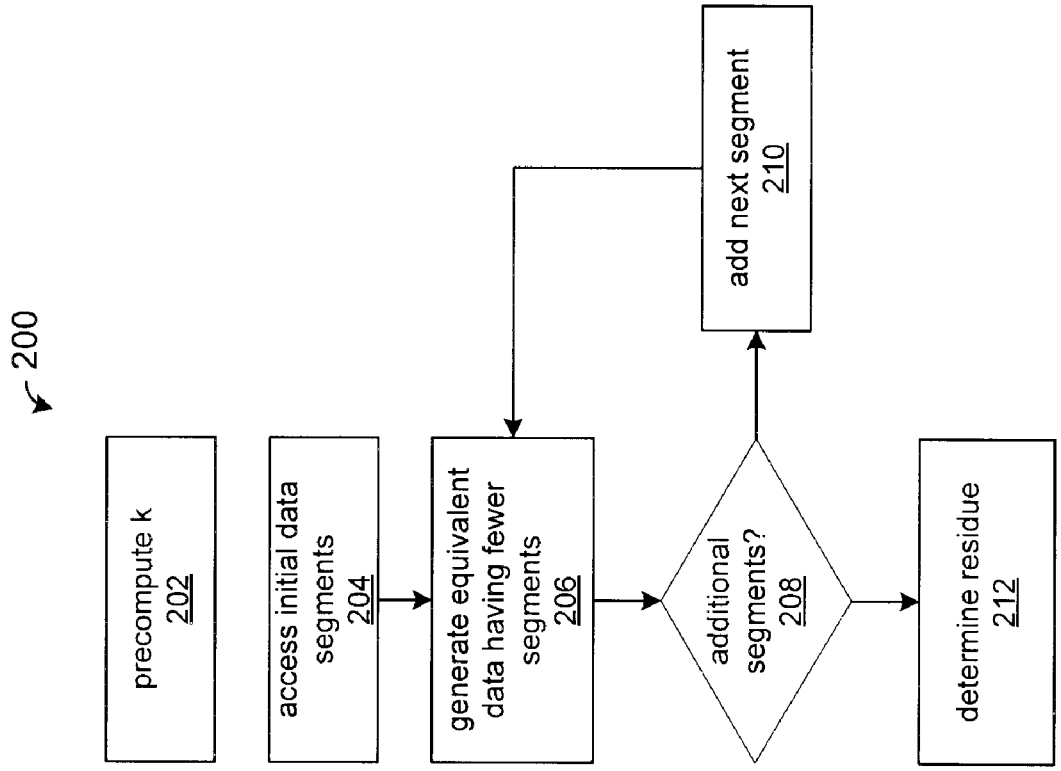
FIG. 3 is a flow chart illustrating determination of a message residue.

FIG. 3 illustrates a sample process for computing a message residue. As shown, after computing k 202, the initial data segments 204 are reduced 206 to a set of fewer but equivalent data segments with respect to the residue. If additional segments remain 208, reducing 206 continues with the next segment 210. Otherwise, a residue value is determined for the final set of segments.

A variety of approaches can determine the final residue value such as a lookup table or a wide variety of algorithms to determine a modular remainder. For example, the final segments can be processed using an approach that implements the division process as multiplication. For instance, a n-bit remainder can be expressed as:

$$r_n = L(g^* \cdot (M(s \cdot q+)))$$ [3]

where
L is an operation returning the b-least-significant-bits of data;
$g^*$ is the b-least-significant bits of polynomial g,
M is an operation returning the b-most-significant-bits, and
q+ is the quotient of $(2^{2n}/g)$.

Like the folding techniques described above, this approach can use pre-computed values for $g^*$ and q+ to speed computation.

The techniques described above can be implemented in a wide variety of logic. For example, the techniques may be implemented as instructions disposed on a computer readable storage medium for execution by a processor element (e.g., a CPU (Central Processing Unit) or processor core). The techniques may also be implemented as dedicated hardware. Alternately, some combination may be used such as instructions that take advantage of special hardware components (e.g., a Galois-field (carry-less) multiplier or multiplier configured to handle carry-less multiplication). The logic may be integrated within a discrete component such as a NIC (Network Interface Controller), framer, offload engine, storage processor, and so forth.

Other embodiments are within the scope following claims.

What is claimed is:

1. A computer-implemented method of determining a modular remainder with respect to a polynomial of a message comprised of a series of segments, comprising:
   accessing a strict subset of the segments representing the message, the strict subset consisting of the most significant segments representing the message;
   transforming the strict subset of segments into a smaller set of segments;
   redefining the segments representing the message as a sequence consisting of the smaller set of segments and segments excluded from the strict subset of segments;
   repeating the accessing, transforming, and redefining at least once to generate an output set of segments representing the message;
   determining the modular remainder based on the output set of segments; and
   storing the determined modular remainder.

2. The method of claim 1, wherein the strict subset of segments consists of three segments and the smaller set of segments consists of two segments.

3. The method of claim 1, wherein the modular remainder comprises a CRC (Cyclic Redundancy Check).

4. The method of claim 1, further comprising performing at least one of the following:
   (1) comparing the modular remainder to a previously computed modular remainder for the message; and
   (2) storing the modular remainder in a packet.

5. The method of claim 1,
   wherein the transforming comprises determining based on a multiplication of the most significant segment of the strict subset of segments by a constant k derived by segment size and the polynomial.

6. The method of claim 5,
   wherein the transforming comprises a determination based on the less significant of the strict subset of segments and the multiplication of the most significant segment by a constant derived from the segment size and the polynomial.

7. The method of claim 6, further comprising:
   accessing a set of precomputed constants based on at least one of: (a) the polynomial and (b) a size of a segment.

8. The method of claim 1,
   wherein the message comprises a set of segments, S, of size n where n is an integer;
   wherein a constant $k=2^{2n}$ mod polynomial; and
   wherein the transforming comprises XOR-ing polynomial multiplication of the most significant remaining segment of S by k and XOR-ing with the next most significant segments of S.

9. A computer readable storage medium comprising instructions to determine a modular remainder with respect to a polynomial of a message comprised of a series of segments, the instructions causing a processor to:
   access a strict subset of the segments representing the message, the strict subset consisting of the most significant segments representing the message;
   transform the strict subset of segments to into a smaller set of segments;
   redefine the segments representing the message as a sequence consisting of the smaller set of segments and segments excluded from the strict subset of segments;
   repeat the accessing, transforming, and redefining multiple times to generate an output set of segments representing the message;
   determine the modular remainder based on the output set of segments; and
   storing the determined modular remainder.

10. The computer readable storage medium of claim 9, wherein the strict subset of segments consists of three segments and the smaller set of segments consists of two segments.

11. The computer readable storage medium of claim 9, wherein the modular remainder comprises a CRC (Cyclic Redundancy Check).

12. The computer readable storage medium of claim 9, further comprising instructions to cause the processor element to perform at least one of the following:
   (1) compare the modular remainder to a previously computed modular remainder for the message; and
   (2) store the modular remainder in a packet.

13. The computer readable storage medium of claim 9,
   wherein the instructions to perform transform comprise instructions to determine based on a multiplication of the most significant segment of the strict subset of segments by a constant k derived by segment size and the polynomial.

14. The computer readable storage medium of claim 13, wherein the instructions to transform comprise instructions to determine based on the less significant of the subset of segments and the multiplication of the most significant segment by a constant derived from the segment size and the polynomial.

15. The computer readable storage medium of claim 14, further comprising instructions to:

access a set of precomputed constants based on at least one of: (a) the polynomial and (b) a size of a segment.

16. The computer readable storage medium of claim 9, wherein the message comprises a set of segments, S, of size n where n is an integer;

wherein a constant $k=2^{2n}$ mod polynomial; and wherein the instructions to transform comprise instructions to XOR results of polynomial multiplication of the most significant remaining segment of S by k with the next most significant segments of S.

17. The method of claim 1, wherein the segments representing the message comprise segments of equal size, each segment having multiple bits.

* * * * *